United States Patent
Mossavat et al.

(10) Patent No.: US 10,627,213 B2
(45) Date of Patent: Apr. 21, 2020

(54) STATISTICAL HIERARCHICAL RECONSTRUCTION FROM METROLOGY DATA

(71) Applicant: ASML NETHERLANDS B.V., Veldhoven (NL)

(72) Inventors: Seyed Iman Mossavat, Waalre (NL); Remco Dirks, Deurne (NL); Hugo Augustinus Joseph Cramer, Eindhoven (NL)

(73) Assignee: ASML Netherlands B. V., Veldhoven (NL)

( * ) Notice: Subject to any disclaimer, the term of this patent is extended or adjusted under 35 U.S.C. 154(b) by 0 days.

(21) Appl. No.: 15/365,576

(22) Filed: Nov. 30, 2016

(65) Prior Publication Data
US 2017/0160074 A1 Jun. 8, 2017

(30) Foreign Application Priority Data
Dec. 4, 2015 (EP) .................................... 15198069

(51) Int. Cl.
*G01B 11/02* (2006.01)
*G03F 7/20* (2006.01)

(52) U.S. Cl.
CPC .............. *G01B 11/02* (2013.01); *G03F 7/705* (2013.01); *G03F 7/70625* (2013.01)

(58) Field of Classification Search
CPC ..... G01B 11/02; G03F 7/705; G03F 7/70625; G01R 31/307; G01N 23/2251;
(Continued)

(56) References Cited

U.S. PATENT DOCUMENTS 7,230,723 B2 * 6/2007 Yamaguchi ........ G01N 23/2251
250/310
7,430,052 B2 * 9/2008 Shyu ...................... G01B 21/02
356/600
(Continued)

FOREIGN PATENT DOCUMENTS

CN 101261442 9/2008
JP 2015525902 9/2015
(Continued)

OTHER PUBLICATIONS

Nien Fan Zhang et al., "Improving optical measurement uncertainty with combined multitool metrology using a Bayesian approach," Applied Optics, vol. 51, No. 25, pp. 6196-6206 (Sep. 1, 2012).
(Continued)

*Primary Examiner* — Sang H Nguyen
(74) *Attorney, Agent, or Firm* — Pillsbury Winthrop Shaw Pittman LLP

(57) ABSTRACT

A method including obtaining measurement results of a device manufacturing process or a product thereof, obtaining sets of one or more values of one or more parameters of a distribution by fitting the distribution against the measurement results, respectively, and obtaining, using a computer, a set of one or more values of one or more hyperparameters of a hyperdistribution by fitting the hyperdistribution against the sets of values of the parameters.

20 Claims, 15 Drawing Sheets

(58) Field of Classification Search
CPC ....... G06K 9/4604; G06T 7/0006; G06T 7/13; G06T 7/60
See application file for complete search history.

(56) References Cited

U.S. PATENT DOCUMENTS

| | | | |
|---|---|---|---|
| 8,289,515 B2* | 10/2012 | Cohen | G01B 11/0625 250/548 |
| 8,369,602 B2* | 2/2013 | Yamaguchi | G06K 9/4604 345/428 |
| 9,714,827 B2 | 7/2017 | Van Der Schaar et al. | |
| 2001/0032029 A1* | 10/2001 | Kauffman | G06Q 10/06 700/99 |
| 2003/0014379 A1* | 1/2003 | Saias | G06Q 10/06 706/45 |
| 2003/0021463 A1* | 1/2003 | Yamaguchi | G01N 21/95684 382/145 |
| 2006/0003303 A1* | 1/2006 | Almond | G09B 7/02 434/322 |
| 2008/0220345 A1 | 9/2008 | Van De Kerkhof et al. | |
| 2009/0057395 A1* | 3/2009 | He | G06K 9/6226 235/379 |
| 2009/0150308 A1* | 6/2009 | Wang | G06K 9/6278 706/12 |
| 2010/0009444 A1 | 1/2010 | Herlitze et al. | |
| 2013/0181711 A1* | 7/2013 | Chaari | G01R 33/5611 324/309 |
| 2015/0032426 A1* | 1/2015 | Chen | G01V 99/005 703/2 |
| 2015/0177166 A1 | 6/2015 | Cramer et al. | |
| 2015/0226660 A1* | 8/2015 | Agnihotram | G06Q 10/00 702/34 |
| 2015/0300965 A1 | 10/2015 | Sezginer et al. | |
| 2016/0333069 A1* | 11/2016 | Herlitze | C07K 14/705 |
| 2017/0169105 A1* | 6/2017 | Andrade Silva | G06F 17/30663 |
| 2017/0177826 A1* | 6/2017 | Alexander | G06N 20/00 |
| 2017/0261949 A1* | 9/2017 | Hoffmann | G06N 7/005 |

FOREIGN PATENT DOCUMENTS

| | | |
|---|---|---|
| JP | 2015528125 | 9/2015 |
| JP | 2015531056 | 10/2015 |
| TW | 201403257 | 1/2014 |
| WO | 2012/037067 | 3/2012 |

OTHER PUBLICATIONS

R. M. Silver et al., "Optimizing Hybrid Metrology through a Consistent Multi-Tool Parameter Set and Uncertainty Model," Proc. of SPIE, vol. 9050, pp. 905004-1-905004-8 (Apr. 14, 2014).
E. C. Marshall et al., "Identifying outliers in Bayesian hierarchical models: a simulation-based approach," Bayesian Analysis, vol. 2, No. 2, pp. 409-444 (2007).
Kenji Tamaki et al., "Multiparametric Virtual Metrology Model Building by Job-Shop Data Fusion Using a Markov Chain Monte Carlo Method," IEEE Transactions on Semiconductor Manufacturing, vol. 26, No. 3, pp. 319-327 (Aug. 2013).
R. M. Silver et al., "A Bayesian Statistical Model for Hybrid Metrology to Improve Measurement Accuracy," Proc. of SPIE, vol. 8083, pp. 808307-1-808307-11 (2011).
Costas J. Spanos et al., "Enhancing Metrology by Combining Spatial Variability and Global Inference," Proc. of SPIE, vol. 8681, pp. 86813E-1-86813E-6 (2013).
International Search Report and Written Opinion dated Feb. 22, 2017 in corresponding International Patent Application No. PCT/EP2016/077682.
Mark-Alexander Henn et al., "Optimizing hybrid metrology: rigorous implementation of Bayesian and combined regression," Journal of Micro/Nanolithography, MEMS, and MOEMS, vol. 14, No. 4, pp. 044001-1-044001-8 (Oct.-Dec. 2015).
Sangheum Hwang et al., "Robust Relevance Vector Machine with Variational Inference for Improving Virtual Metrology Accuracy," IEEE Transactions on Semiconductor Manufacturing, vol. 27, No. 1, pp. 83-94 (Feb. 2014).
"Section 8.1.10: How can Bayesian methodology be used for reliability evaluation?" NIST/SEMATECH e-Handbook of Statistical Methods, Retrieved from the Internet: URL: https://web.arehive.org/web/20150723102746/http://www.itl.nist.gov/div898/handbook/apr/section1/aprla.htm. 3 pages (purportedly dated Jul. 23, 2015) (Retrieved Feb. 10, 2017).
Office Action issued in corresponding Taiwan Patent Application No. 105139660, dated Mar. 22, 2018.
Taiwanese Office Action issued in corresponding Taiwanese Patent Application No. 105139660, dated Sep. 3, 2018.
Japanese Office Action issued in corresponding Japanese Patent Application No. 2018-523472, dated Jul. 29, 2019.
Chinese Office Action issued in corresponding Chinese Patent Applicaton No. 2016300710402, dated Dec. 3, 2019.

* cited by examiner

STATISTICAL HIERARCHICAL RECONSTRUCTION FROM METROLOGY DATA

This application claims the benefit of priority of European Application No. 15198069.5, which was filed on Dec. 4, 2015. The content of the foregoing application is incorporated herein in its entirety by reference.

FIELD

The present disclosure relates to methods and apparatuses for metrology usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction image or pattern from which a property of interest of the target can be determined. The diffraction image or pattern may include all properties of the diffracted radiation.

SUMMARY

In order that the radiation that impinges on to the substrate is diffracted, an object with a specific shape is printed on to the substrate and is often known as a scatterometry target or simply a target. As mentioned above, it is possible to determine the actual shape of a scatterometry object using a cross-section scanning electron microscope and the like. However, this involves a large amount of time, effort and a specialized apparatus and is less suited for measurements in a production environment because a separate specialized apparatus is required in line with a normal apparatus in, for example, a lithographic cell.

Determination of the property of interest may be performed by various techniques: e.g., reconstruction of the target by fitting a model to the measured signal using various numerical techniques such as iterative approaches to find the best fit iterative approaches such as rigorous coupled wave analysis or finite element methods; library searches; and principal component analysis to reduce the time to find the best fit.

To perform such reconstruction, a profile model ("profile") of the target may be used. Good nominal values for parameters (representative of the data as a whole) can make the profile more robust.

Disclosed herein is a method comprising: obtaining measurement results of a device manufacturing process or a product thereof; obtaining sets of one or more values of one or more parameters of a distribution by fitting the distribution against the measurement results, respectively; obtaining, using a computer, a set of one or more values of one or more hyperparameters of a hyperdistribution by fitting the hyperdistribution against the sets of values of the parameters.

According to an embodiment, the measurement results have a same statistical distribution.

According to an embodiment, the statistical distribution is a normal distribution.

According to an embodiment, obtaining the measurement results comprises measuring a single target using a plurality of measurement recipes.

According to an embodiment, the plurality of measurement recipes differs in polarization, wavelength, incident angle, or a combination thereof.

According to an embodiment, obtaining the measurement results comprises measuring nominally identical copies of a target.

According to an embodiment, obtaining the measurement results comprises obtaining diffraction images using a scatterometer, obtaining overlay from overlapping targets, obtaining critical dimension, obtaining sidewall angle (SWA), obtaining height, obtaining extinction coefficient, obtaining refractive index, dispersion model parameters, or a combination thereof, from a pattern on a substrate.

According to an embodiment, obtaining the measurement results comprises obtaining processing parameters of the device manufacturing process.

According to an embodiment, the method further comprises feeding back the values of the one or more hyperparameters to the fitting of the distribution against the measurement results.

Disclosed herein is a method comprising: obtaining a value of a parameter of a simulation model; obtaining a plurality of simulated measurement results using the simulation model; obtaining a value of a hyperparameter using any of the above methods; determining, using a computer, credibility of the value of the hyperparameter or credibility of the value of the parameter using the value of the hyperparameter and the value of the parameter.

According to an embodiment, determining credibility of the value of the hyperparameter or credibility of the value of the parameter comprises using a standard deviation of a difference between the value of the hyperparameter and the value of the parameter.

According to an embodiment, the method further comprises determining a quality of the simulated measurement results using the credibility.

According to an embodiment, determining credibility of the value of the hyperparameter or credibility of the value of the parameter comprises using an average predictive uncertainty.

Disclosed herein is a method comprising: obtaining a first value of a hyperparameter or a first hyperdistribution using any of the above methods from measurement results under a first condition; obtaining a second value of the hyperparameter or a second hyperdistribution using the method of any of the above methods from measurement results under a second condition; determining consistency between measurements at the first condition and measurements at the second condition using the first or second value of the hyperparameter or the first or second hyperdistribution.

According to an embodiment, the measurements are diffraction based overlay, diffraction based focus, reconstruction based CD, differential based CD, imaging based CD or reconstruction based profile parameters.

Disclosed herein is a method comprising: obtaining a value of a hyperparameter or a hyperdistribution; obtaining a measurement result not used in determination of the value of the hyperparameter; updating, using a computer, the value of the hyperparameter or hyperdistribution using the measurement result.

Disclosed herein is a method comprising: obtaining a value of a hyperparameter or a hyperdistribution; simulating one or more values of another parameter using the value of the hyperparameter or the hyperdistribution; determining, using a computer, a value or distribution of the other parameter from the simulated values.

According to an embodiment, the other parameter is a diffraction image, overlay, critical dimension, sidewall angle, height, extinction coefficient, refractive index, a processing parameter of a device manufacturing process, or a combination thereof.

Disclosed herein is a method comprising: obtaining a value of a hyperparameter; obtaining a measurement result; setting an initial value of a parameter of a model using the value of the hyperparameter; fitting, using a computer, the model to the measurement result.

Disclosed herein is a computer program product comprising a computer readable medium having instructions recorded thereon, the instructions when executed by a computer implementing any of the methods above.

DETAILED DESCRIPTION

Figure 1:
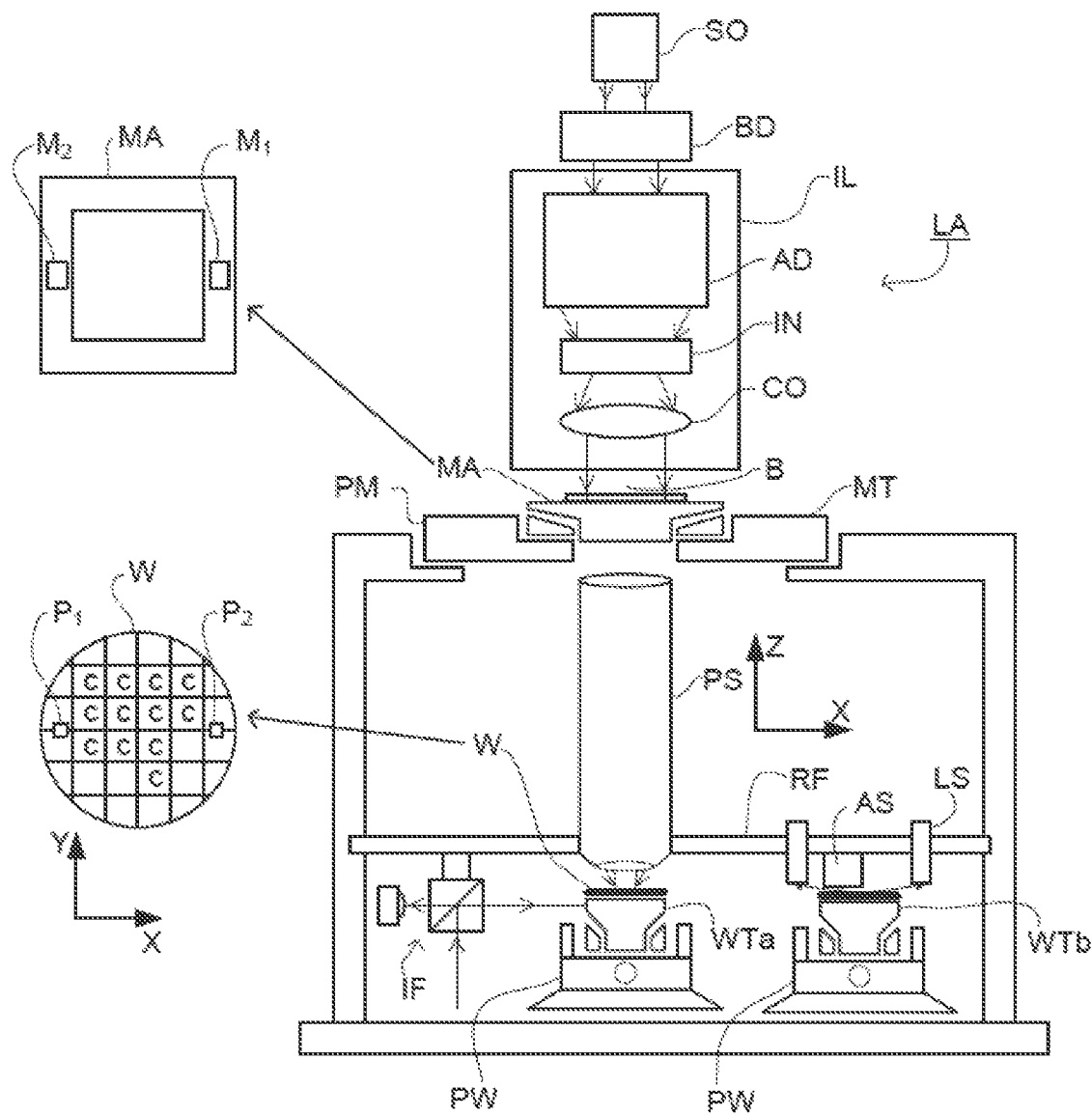
FIG. 1 depicts a lithographic apparatus.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
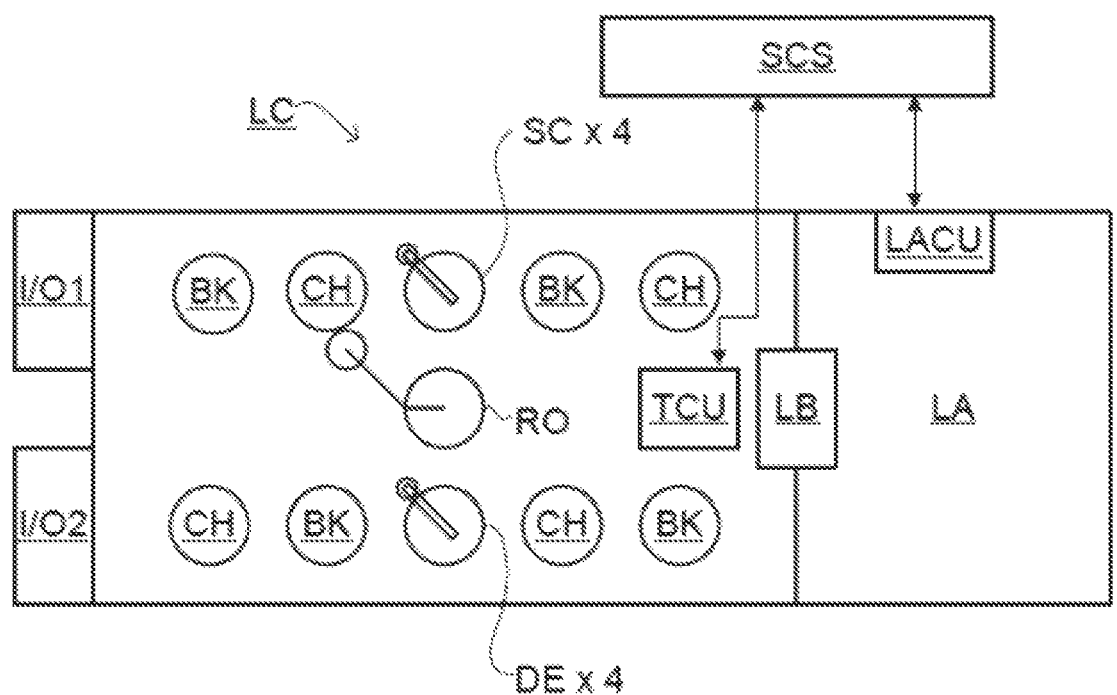
FIG. 2 depicts a lithographic cell.

As shown in FIG. 2, the lithographic apparatus LA forms part of a lithographic system, referred to as a lithographic cell LC or a lithocell. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Inspecting exposed substrates to measure properties such as overlay errors between subsequent layers, line thicknesses, critical dimensions (CD), etc. can improve consistency and fidelity of the exposure by the lithographic apparatus. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties vary locally within a substrate and/or from substrate to substrate. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
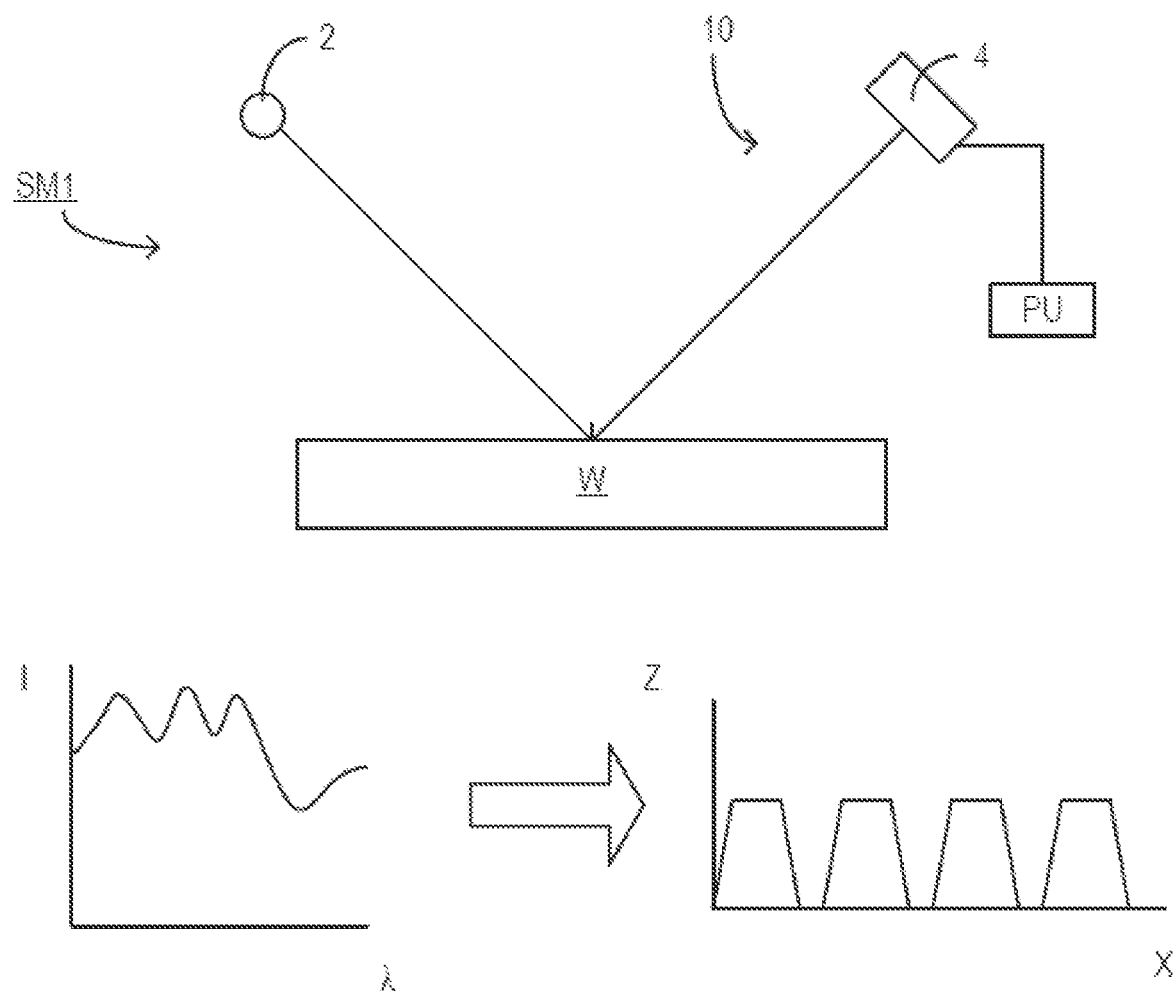
FIG. 3 depicts an example scatterometer.

FIG. 3 depicts a scatterometer which may be used in an embodiment. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
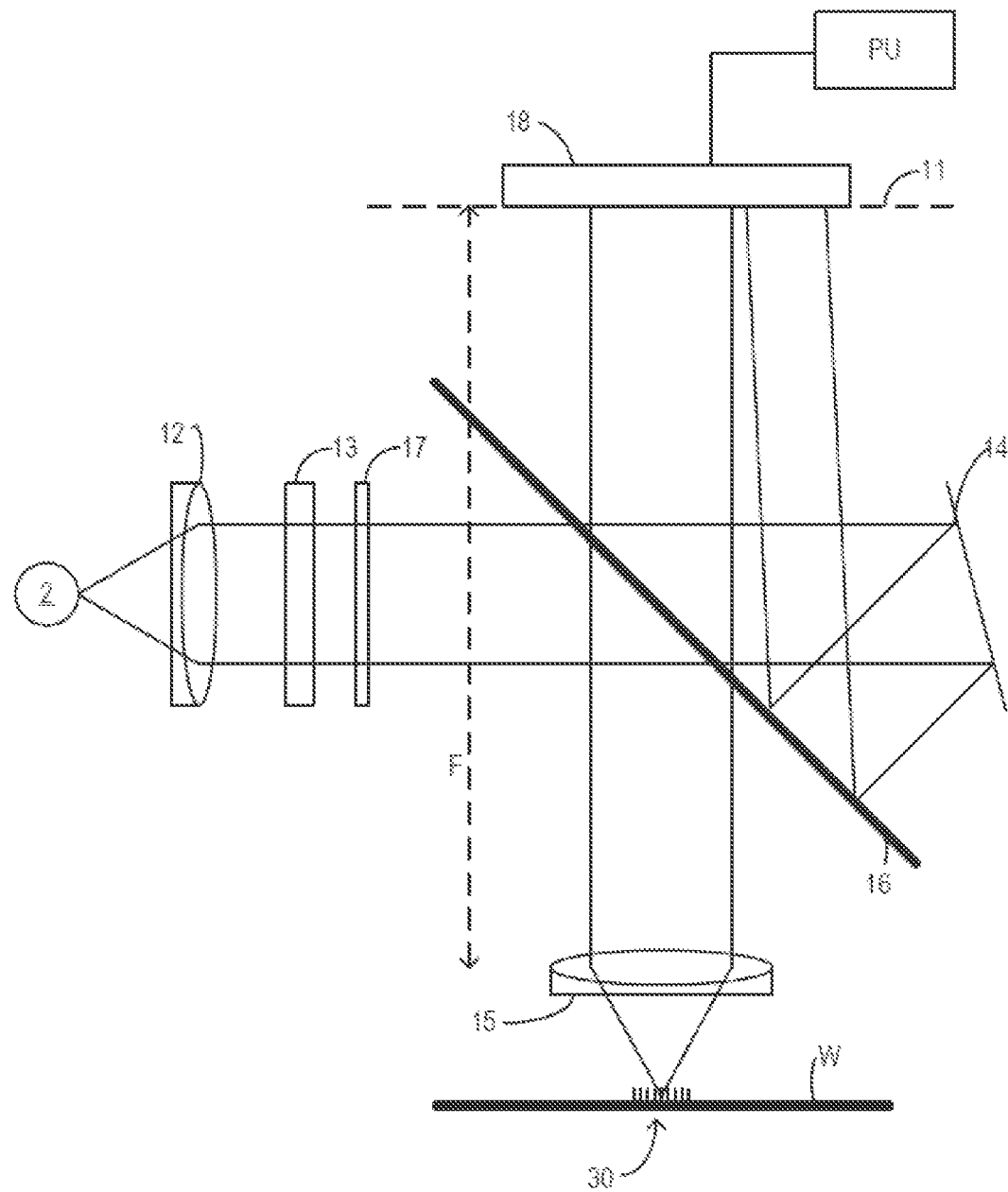
FIG. 4 depicts an example scatterometer.

Another scatterometer that may be used with an embodiment is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is desirably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction image that is reflected from a hypothetical target. Comparison of the calculated spectrum with the measured spectrum reveals which hypothetical target corresponds to the measured target. In other words, target shape information is obtained for CD (critical dimension) uniformity and overlay or focus metrology. Overlay metrology is a measuring system in which the overlay of two targets is measured in order to determine whether two layers on a substrate are aligned or not. Focus metrology determines the focus (and/or dose) setting used when forming the target. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using a scatterometer, such as that described above in combination with modeling of a target structure such as the target 30 and its diffraction properties, measurement of the shape and other parameters of the structure can be performed in a number of ways. In a first type of process, represented by FIG. 5, a diffraction image based on a first estimate of the target shape (a first candidate structure) is calculated and compared with the observed diffraction image. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction image observed from the measurement target is compared with the library of calculated spectra to find a best fit. Both methods can be used together: a coarse fit can be obtained from a library, followed by an iterative process to find a best fit.

Figure 5:
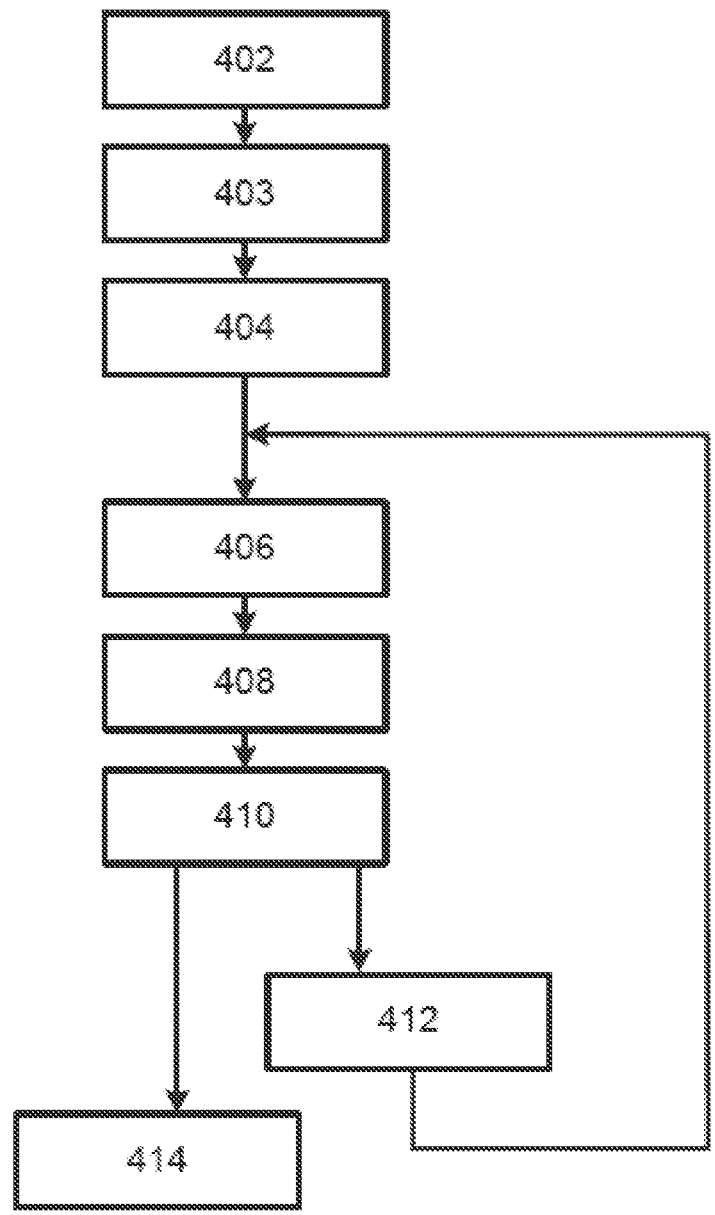
FIG. 5 is a flowchart depicting an example process for reconstruction of a structure from scatterometer measurements.
Figure 6:
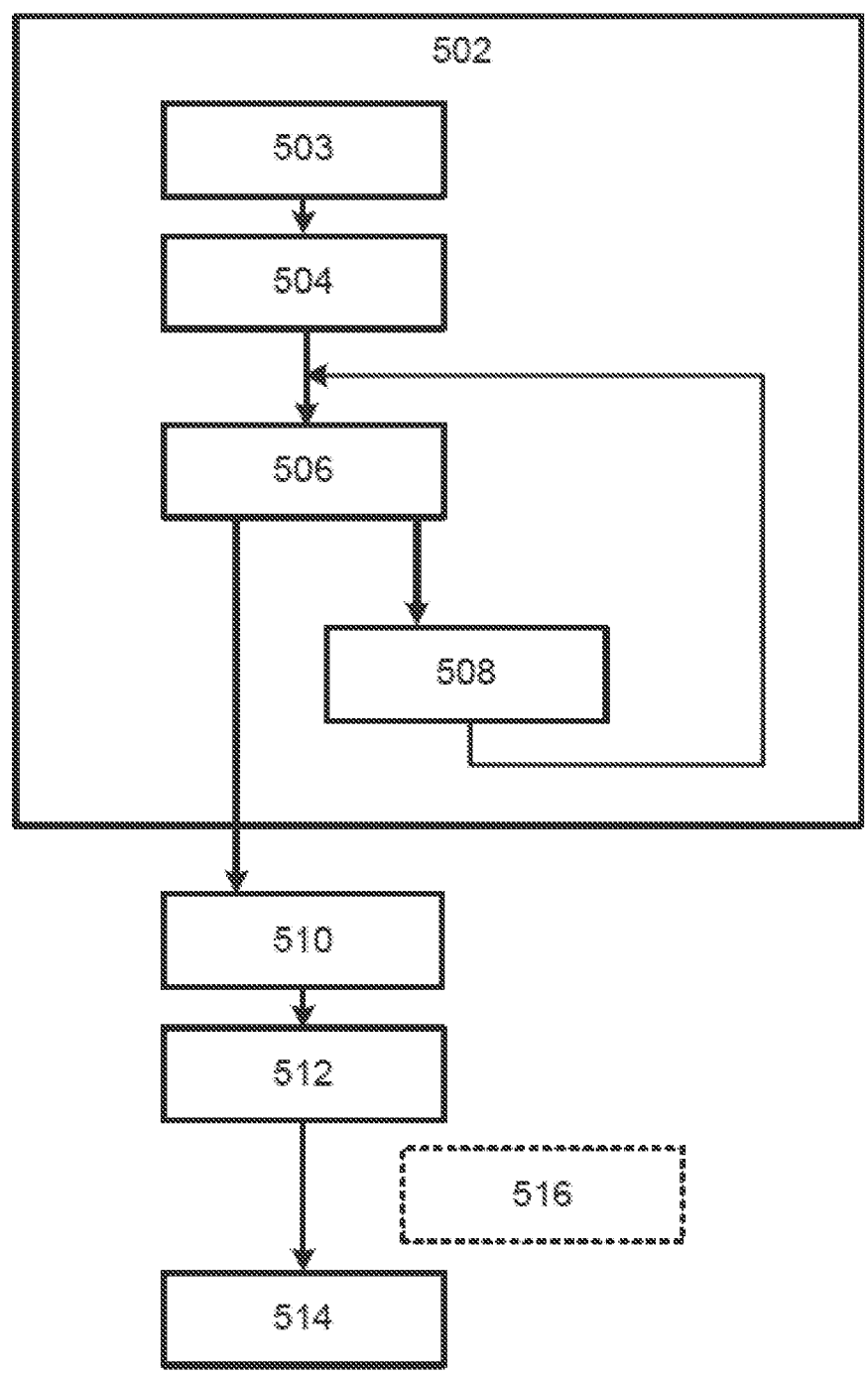
FIG. 6 is a flowchart depicting an example process for reconstruction of a structure from scatterometer measurements.

Throughout the description of FIG. 5 and FIG. 6, the term 'diffraction image' will be used, on the assumption that the scatterometer of FIG. 3 or 4 is used. Diffraction image is an example of an inspection data element within the context of this disclosure. The skilled person can readily adapt the teaching to different types of scatterometer, or even other types of measurement instrument.

FIG. 5 is a flowchart of the steps of a method of measurement of the target shape and/or material properties, described in summary. The steps are as follows, and are then described in greater detail thereafter:

402—Measure Diffraction Image;
403—Define Model Recipe;
404—Estimate Shape Parameters p1(0), p2(0), p3(0), . . . ;
406—Calculate Model Diffraction Image;
408—Compare Measured v Calculated Image;
410—Calculate Cost Function;
412—Generate Revised Shape Parameters p1(1), p2(1), p3(1), . . . ;
414—Report Final Shape Parameters The target will be assumed for this description to be periodic in only 1 direction (1-D structure). In practice it may be periodic in 2 directions (2-dimensional structure), and the processing will be adapted accordingly.

At 402, the diffraction image of the actual target on the substrate is measured using a scatterometer such as those described above. This measured diffraction image is forwarded to a calculation system such as a computer. The calculation system may be the processing unit PU referred to above, or it may be a separate apparatus.

At 403, a profile is established which defines a parameterized model of the target structure in terms of a number of parameters pi (p1, p2, p3 and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the profile will define many of these to have fixed values, while others are to be variable or 'floating' parameters for the purpose of the following process steps. Moreover, ways will be introduced in which parameters can be permitted to vary without being fully independent floating parameters. For the purposes of describing FIG. 5, only the variable parameters are considered as parameters pi. The profile also defines the settings of the measurement radiation (e.g., dose, wavelength, incident direction) for a given target structure and how to estimate the parameter values by fitting the model to the inspection data.

At 404, a model target shape is estimated by setting initial values pi(0) for the floating parameters (i.e. p1(0), p2(0), p3(0 and so on). Each floating parameter will be generated within certain predetermined ranges, as defined in the recipe.

At 406, the parameters representing the estimated shape, together with the optical properties of the different elements of the model, are used to calculate the scattering properties, for example using a rigorous optical diffraction method such as RCWA or any other solver of Maxwell equations. This gives an estimated or model diffraction image of the estimated target shape.

At 408, 410, the measured diffraction image and the model diffraction image are then compared and their similarities and differences are used to calculate a "cost function" for the model target shape. Optionally, in the calculation of the cost function other criteria can also be used as defined in the profile recipe such as the predetermined ranges for parameters.

At 412, assuming that the cost function indicates that the model needs to be improved before it represents accurately the actual target shape, new parameters p1(1), p2(1), p3(1), etc. are estimated and fed back iteratively into step 406. Steps 406-412 are repeated.

In order to assist the search, the calculations in step 406 may further generate partial derivatives of the cost function, indicating the sensitivity with which increasing or decreasing a parameter will increase or decrease the cost function, in this particular region in the parameter space. The calculation of cost functions and the use of derivatives is generally known in the art, and will not be described here in detail.

At 414, when the cost function indicates that this iterative process has converged on a solution with a desired accuracy, the currently estimated parameters are reported as the measurement of the actual target structure.

The computation time of this iterative process is largely determined by the forward diffraction model used, i.e. the calculation of the estimated model diffraction image using a rigorous optical diffraction theory from the estimated target structure. If more parameters are required, then there are more degrees of freedom. The calculation time increases in principle with the power of the number of degrees of freedom, although this can be alleviated if finite differences are used to approximate the Jacobian. The estimated or model diffraction image calculated at 406 can be expressed in various forms. Comparisons are simplified if the calculated image is expressed in the same form (e.g., spectrum, pupil image) as the measured image generated in step 402.

FIG. 6 is a flowchart of the steps of an alternative method of measurement of the target shape and/or material properties, described in summary. In this method, a plurality of model diffraction images for different target shapes (candidate structures), corresponding to different sets of shape parameter pi(j), are calculated in advance and stored in a library for comparison with a real measurement. The underlying principles and terminology are the same as for the process of FIG. 5. The steps are as follows, and are then described in greater detail thereafter:

502—Generate Library;
503—Define Model Recipe;
504—Sample Shape Parameters p1(0), p2(0), p3(0), . . . ;
506—Calculate and Store Model Diffraction Image;

508—New Sample Shape Parameters p1(1), p2(1), p3(1), . . . ;
510—Measure Diffraction Image;
512—Compare Measured Image v Library Images;
514—Report Final Shape Parameters;
516—Refine Shape Parameters.

At 502, the process of generating the library begins. A separate library may be generated for each type of target structure. The library may be generated by a user of the measurement apparatus according to need, or may be pre-generated by a supplier of the apparatus.

At 503, a profile is established which defines a parameterized model of the target structure in terms of a number of parameters pi (p1, p2, p3 and so on). Considerations are similar to those in step 503 of the iterative process.

At 504, a first set of parameters p1(0), p2(0), p3(0), etc. is generated, for example by generating random values of all the parameters, each within its expected range of values.

At 506, a model diffraction image is calculated and stored in a library, representing the diffraction image expected from a target shape represented by the parameters.

At 508, a new set of shape parameters p1(1), p2(1), p3(1), etc. is generated. Steps 506-508 are repeated tens, hundreds or even thousands of times, until the library which comprises all the stored modeled diffraction images is judged sufficiently complete. Each stored image represents a sample point in the multi-dimensional parameter space. The samples in the library should populate the sample space with a sufficient density that any real diffraction image will be sufficiently closely represented.

At 510, after the library is generated (though it could be before), the real target 30 is placed in the scatterometer and its diffraction image is measured.

At 512, the measured image is compared with the modeled images stored in the library to find the best matching image, which can be the image that leads to the lowest value of the cost function. The comparison may be made with every sample in the library, or a more systematic searching strategy may be employed, to reduce computational burden.

At 514, if a match is found then the estimated target shape used to generate the matching library image can be determined to be the approximate object structure. The shape parameters corresponding to the matching sample are output as the measured shape parameters. The matching process may be performed directly on the model diffraction signals, or it may be performed on substitute models which are optimized for fast evaluation.

At 516, optionally, the nearest matching sample is used as a starting point, and a refinement process is used to obtain the final parameters for reporting. This refinement process may comprise an iterative process very similar to that shown in FIG. 5, for example.

Whether refining step 516 is needed or not is a matter of choice for the implementer. If the library is very densely sampled, then iterative refinement may not be needed because a good match will always be found. On the other hand, such a library might be too large for practical use. A practical solution is thus to use a library search for a coarse set of parameters, followed by one or more iterations using the cost function to determine a more accurate set of parameters to report the parameters of the target substrate with a desired accuracy. Where additional iterations are performed, it would be an option to add the calculated diffraction images and associated refined parameter sets as new entries in the library. In this way, a library can be used initially which is based on a relatively small amount of computational effort, but which builds into a larger library using the computational effort of the refining step 516. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 406 and 506, i.e. the calculation of the estimated model diffraction image using a rigorous optical diffraction theory from the estimated target structure shape.

Alternatively of fitting a parameterized shape and material model to the measured signal, it is also possible to determine only one or a few parameters of the target that are related to the conditions of the production process of the target, such as focus or dose of the lithography system, process conditions of the etcher, or deposition temperature of the deposition tool. An empirical calibration may be used to relate the measured signal to the relevant process parameter.

The creation of a profile involves multiple refinements of the profile, wherein the physical model is gradually adjusted to best represent the inspection data and best fulfill the optional other criteria. The inspection data may comprise inspection data elements. The inspection data elements may be images, diffraction images (if diffraction based scatterometry is being used), spectra or pupil images; or else may be reconstructed parameter values obtained from such diffraction images, etc. Each of the inspection data elements may be obtained by inspection of a corresponding target structure, e.g., using a scatterometer such as those described above. Each of these inspection data elements may be described by a plurality of intensity values. The adjustments are typically based upon the results of reconstructions. Reconstructions, as described, fit the model to the inspection data, thereby transforming the inspection data elements into parameter values. At the beginning of the procedure, reconstructions may fail as uncertainties may be large. It may therefore be more effective to reconstruct only one or a few measurements rather than the complete set of data.

To make a profile more robust, the nominal parameter values for the profile should be well chosen. Ideally, to properly estimate these nominal parameter values, many target structures should be reconstructed. However, this may take too much time. Consequently, it may be the case that only one or a few target structures are reconstructed to provide nominal parameter values. Should the selected target structure(s) not be a good representation of the target structures generally, there may be a significant bias to the measured values and the profile will not be optimal.

To obtain nominal parameter values, one or more target structure(s) may be randomly selected for reconstruction. A typical refinement is to only choose target structures which lie within a band between 30 mm and 120 mm from the center of a substrate (target structures too close to the center or edge are not considered ideal). However, it can be demonstrated that there may be significant variation in the values for certain parameters even for target structures which meet this criterion. Using the example of mid-CD (CD as measured at half the height of the object) as the parameter being considered, it can be shown that target structures within the 30 mm-120 mm band may still have a standard deviation of between $2\sigma$ and $2.5\sigma$ away from the mean value. Selecting one of these target structures for reconstruction to find nominal parameter values would be far from ideal.

Statistical hierarchical reconstruction may be used to extract useful information from a group of measurement results. For example, statistical hierarchical reconstruction may be used to determine a probable value of a parameter, which may be used as the nominal parameter value. Statistical hierarchical reconstruction certainly is not limited to the use of determining the nominal parameter value.

Figure 7:
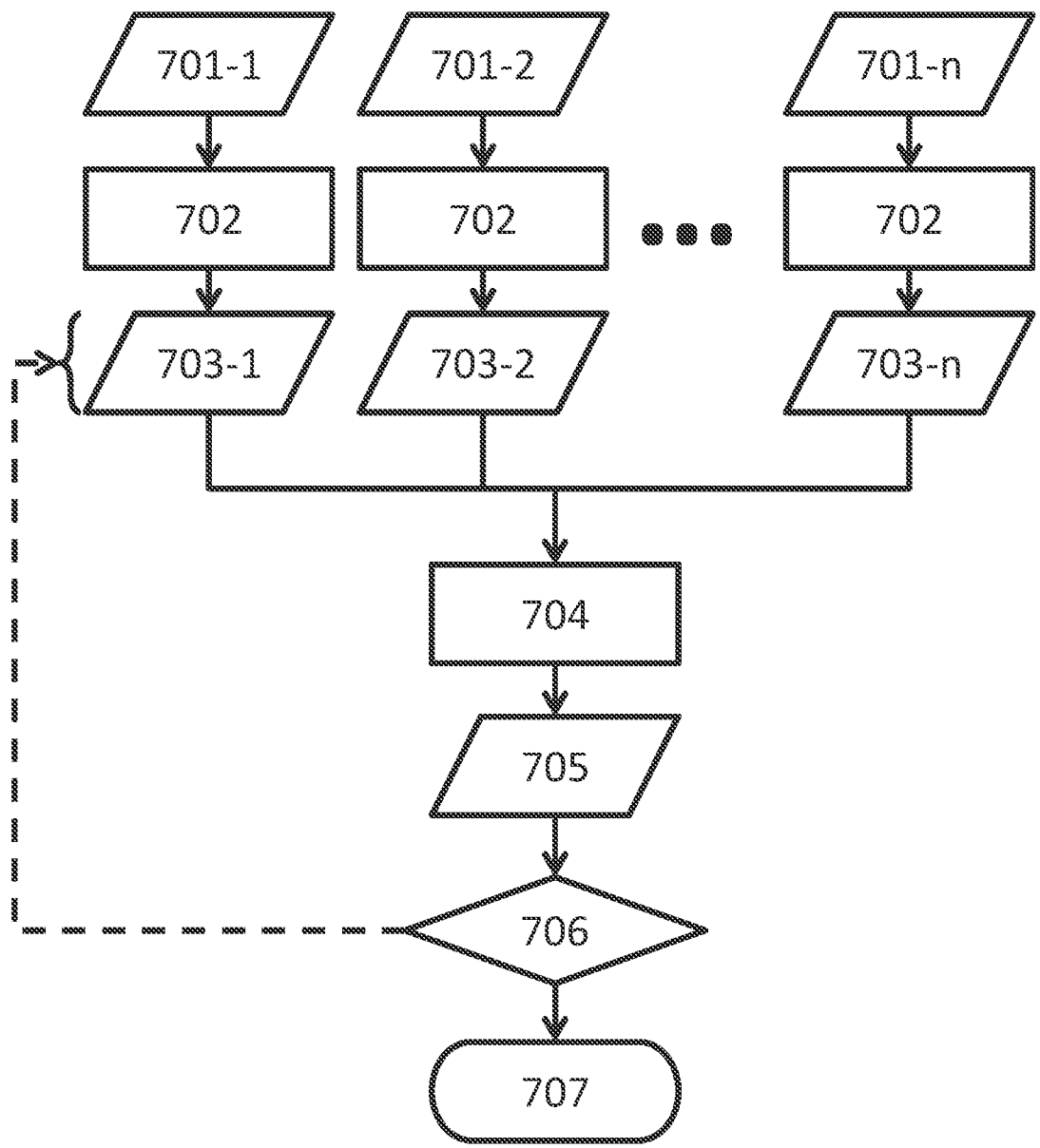
FIG. 7 schematically shows a flow of statistical hierarchical reconstruction, according to an embodiment.

FIG. 7 schematically shows a flow of statistical hierarchical reconstruction, according to an embodiment. A group of measurement results **701-1, 701-2, . . . , 701-*n* are obtained. The group of measurement results 701-1, 701-2, 701-*n* may have the same statistical distribution. An example of these measurement results may be results obtained by measuring a single target using a group of different measurement recipes (e.g., with different polarization, or different wavelength, or different incident angle, etc.). Another example of the measurement results may be results obtained by measuring a group of nominally identical copies of a target (e.g., at different locations of a substrate or manufactured under different processing conditions). Yet another example of the measurement results may be results obtained by measuring reflected radiation from a film on a substrate. Examples of the measurements include obtaining diffraction images using a scatterometer such as those described above, obtaining shape and material parameters such as overlay from overlapping targets, CD, sidewall angle (SWA), height, extinction coefficient, refractive index, dispersion model parameters, etc. from a pattern on a substrate, and obtaining processing parameters of a device manufacturing process such as a lithography process, an etching process, or a deposition process. The measurements may also be diffraction based overlay, diffraction based focus, reconstruction based CD, differential based CD, imaging based CD or reconstruction based profile parameters. The measurements may be on a lithographic process (e.g., photolithography, e-beam lithography), or a product of the lithographic process. Measurements of device manufacturing can include measurements on an apparatus used in the device manufacturing. A distribution 702 with one or more parameters is then fit against each of the group of measurement results 701-1, 701-2, 701-*n*. The distribution 702 may be individually fit against each of the group of measurement results 701-1, 701-2, . . . , 701-*n*—the distribution 702 is not fit such that it matches all of the group of measurement results 701-1, 701-2, . . . , 701-*n* at the same time. Sets of values 703-1, 703-2, . . . , 703-*n* of one or more parameters of the distribution 702 is obtained from the fitting against the group of measurement results 701-1, 701-2, . . . , 701-*n*, respectively. For example, the parameters may include the standard deviation of each of the measurement results 701-1, 701-2, . . . , 701-*n* and may be used as a quantification of fitting error. A distribution 704 with one or more parameters is fit against the sets of values 703-1, 703-2, . . . , 703-*n*. Distribution 704 may contain information about mean of the values 703-1, 703-2, . . . , 703-*n* of the one or more parameters of the distribution 702 as well as variations of these values, and may contain information of the statistics of a fitting residual. Distribution 704 may be used to quantify the variance of the values 703-1, 703-2, . . . , 703-*n* of the one or more parameters of the distribution 702. Because the distribution 704 is a distribution of the parameters of the distribution 702, the distribution 704 can be referred to as a "hyperdistribution" and the parameters of the distribution 704 can be referred to as "hyperparameters." Values 705 of the one or more hyperparameters of the distribution 704** are obtained from this fitting.

The distribution 704, optionally in combination with prior fitting errors, can be used to modify the fitting of the distribution 702, and in turn to update the values **703-1, 703-2, . . . , 703-*n*, and then the hyperparameters. The distribution 704 or the hyperparameters may contain information of the fitting errors in fitting the distribution 702. The fitting of the distribution 702 may be done using a cost function including at least a term characterizing the fitting errors and at least a term characterizing the hyperparameters. One way to modify the fitting is by updating the cost function with the hyperparameters in each iteration. This process iterates until convergence. Namely, in 706, it is determined whether convergence occurs. If not, the flow goes back to fitting the distribution 702 with the values 705. If yes, the flow ends at 707**. The convergence can be measured via different methods including examining the convergence of a variational lower bound to Bayesian model evidence. Other fitting mechanism for the hierarchical structure exists, including MCMC sampling such as metropolis hastings or Gibbs sampling.

The following example may be used to illustrate the flow in FIG. 7. The group of measurement results **701-1, 701-2, 701-*n* may be a group of SEM images of copies of the same feature imaged onto different locations on a substrate. The model 702 may be a probability distribution of the CD. For example, the distribution 702 may be a normal distribution with two parameters (expectation and standard deviation). The model 702 can be fit to each of the SEM images, which yields a set of values (i.e., one of the sets 703-1, 703-2, . . . , 703-*n*) of the expectation and standard deviation of the CD for each of the SEM images. The expectation for a SEM image may be considered as the CD measured from that image. The distribution 704 may be a probability distribution of the expectations. For example, the distribution 704 may be a normal distribution with two parameters (expectation and standard deviation). The expectation of the distribution 704 may be obtained by fitting the distribution 704 against the expectations of the distribution 702. The expectation of the distribution 704** may be used to estimate a nominal value of the CD.

Figure 8:
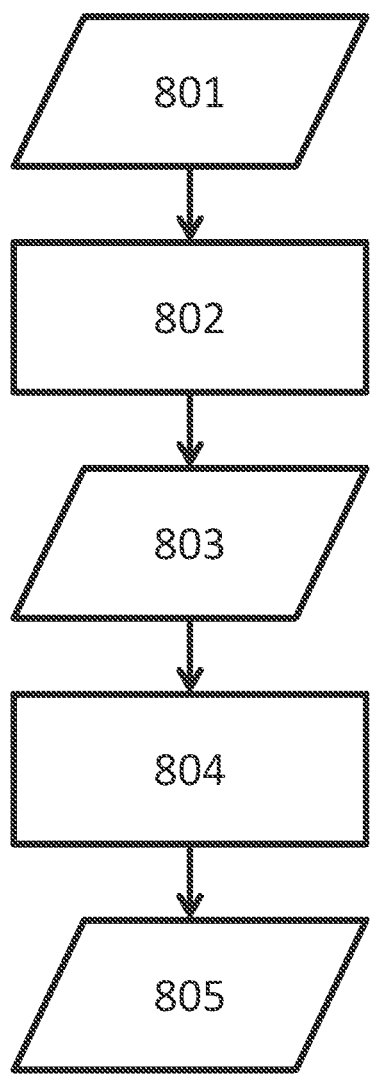
FIG. 8 schematically shows a flow of verifying the effectiveness of the statistical hierarchical reconstruction illustrated in FIG. 7.

The effectiveness of the statistical hierarchical reconstruction illustrated in FIG. 7 may be verified using the flow in FIG. 8. A value 801 of a parameter of a simulation model 802 is obtained. The simulation model 802 is used to obtain a plurality of simulated measurement results 803. The simulated measurement results 803 may be provided to the statistical hierarchical reconstruction flow 804 (e.g., the flow of FIG. 7). The statistical hierarchical reconstruction flow 804 yields a value 805 of a hyperparameter that should correspond to (e.g., be the expectation of) the value 801. The closer the value 805 is to the value 801, the more credible the value 805 is.

Figure 9:
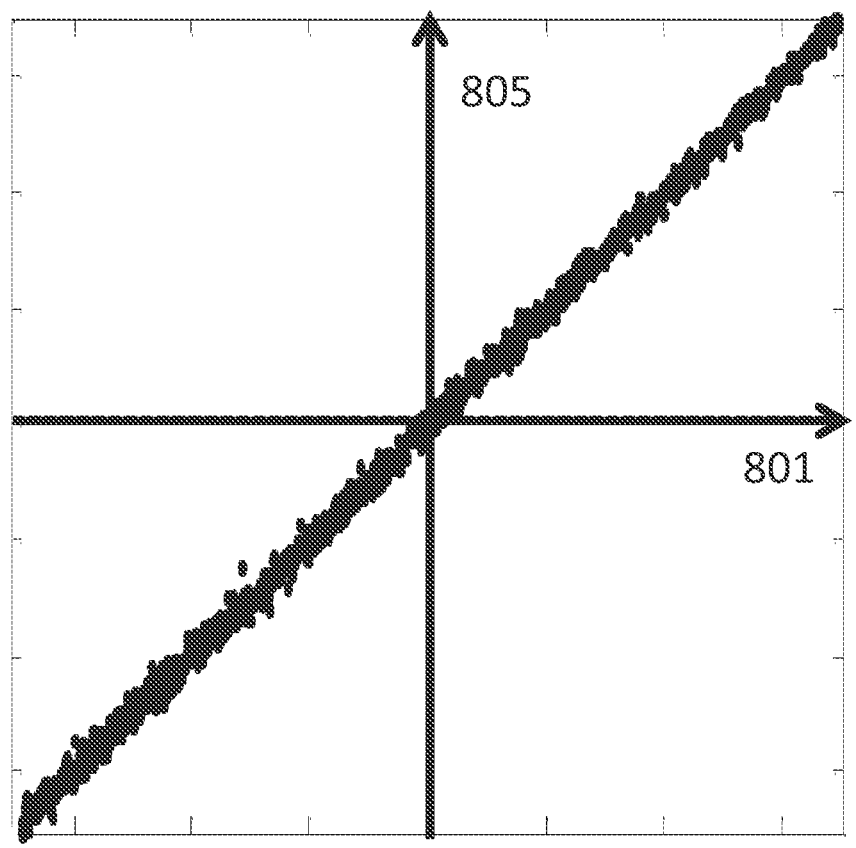
FIG. 9 shows examples of the results of the verification flow of FIG. 8.

FIG. 9 shows examples of the results of the verification flow of FIG. 8. The horizontal axis is the value 801 of the parameter (e.g., SWA) and the vertical axis is the corresponding value 805 from the statistical hierarchical reconstruction. FIG. 9 shows an essentially straight line with a slope of roughly one and intercept of roughly zero, which together indicate that the statistical hierarchical reconstruction is highly credible.

The credibility of the value of the hyperparameter or the credibility of the values of the parameters can also be indicated by the closeness between (1) the standard deviation of the difference (the reconstruction error) between the value 805 and the value 801 and (2) the average predictive uncertainty, i.e. the average of standard deviations of distributions 703-1 through 703-n. The standard deviations of the distributions 703-1 through 703-n directly depend on the distribution 704. Table 1 shows an example of these two standard deviations for a number of parameters.

TABLE 1

| Parameter | σ of the difference between the value 805 and the value 801 | σ obtained from the statistical hierarchical reconstruction |
| --- | --- | --- |
| aSi.Height | 0.87 | 0.93 |
| HM.Height | 0.13 | 0.13 |
| aC.Height | 0.22 | 0.22 |
| SiOC.Height | 0.24 | 0.27 |
| BARC.Height | 0.25 | 0.28 |
| Resist.Height | 0.11 | 0.11 |
| Resist.MCD | 0.047 | 0.049 |
| Resist.SWA | 0.15 | 0.15 |
| k@425 nm | 0.0010 | 0.0010 |
| n@425 nm | 0.0013 | 0.0014 |

Figure 10:
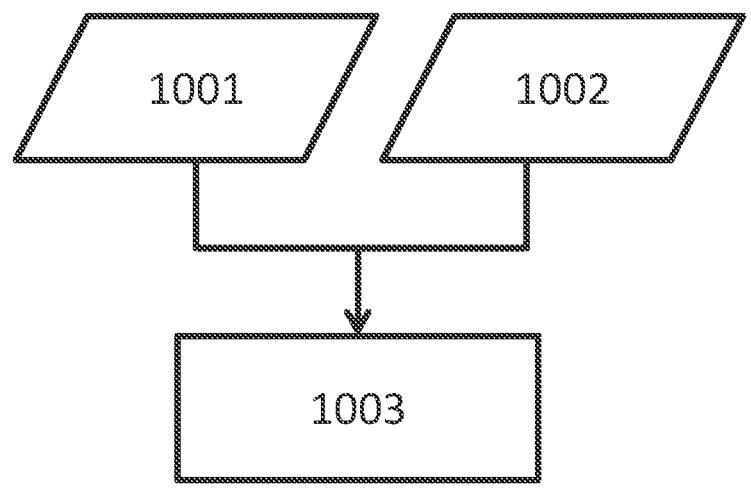
FIG. 10 schematically shows a flow to evaluate the consistency between measurements at different conditions.

The statistical hierarchical reconstruction can be used to evaluate the consistency between measurements at different conditions. For example, when the measurements are diffraction based overlay, the different conditions may be diffraction at different wavelengths. As shown in the flow in FIG. 10, the measurement results at each condition can be used in the flow of FIG. 7 to obtain a set (e.g., 1001 and 1002) of values of the hyperparameters and a hyperdistribution. The sets of values of the hyperparameters or the hyperdistributions at each of the conditions can be used to determine, at 1003, the consistency between the measurements at these conditions. For example, the Kolmogorov-Smirnov test (KS test) can be used to determine whether the hyperdistributions at the different conditions are consistent.

Figure 11A:
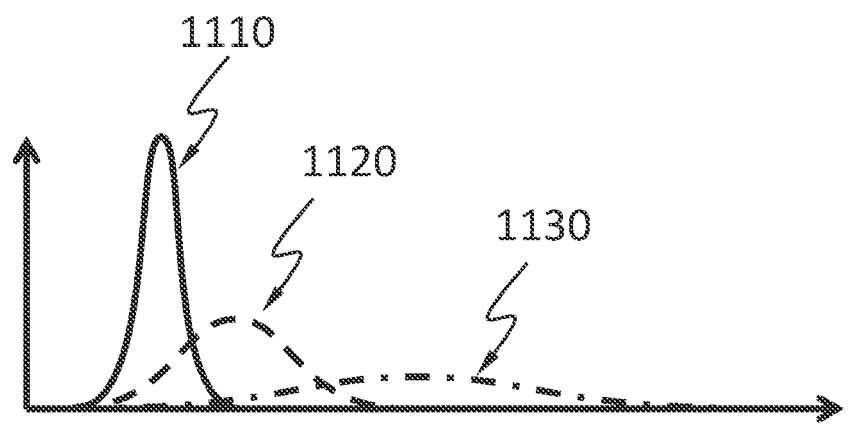
FIG. 11A shows examples of hyperdistributions that are not absolutely inconsistent.
Figure 11B:
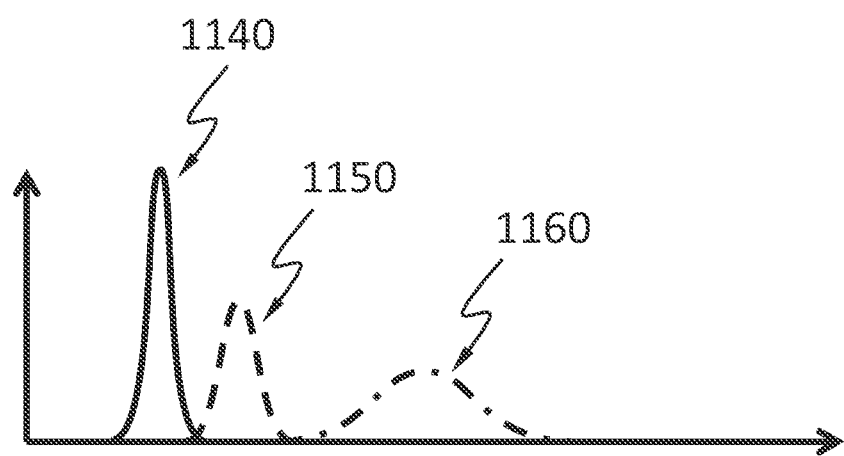
FIG. 11B shows examples of hyperdistributions that are inconsistent.

FIG. 11A shows an example of three hyperdistributions 1110, 1120 and 1130 obtained from measurements of SWA at three different wavelengths. The hyperdistributions 1110, 1120 and 1130 have a different mean. Because these hyperdistributions 1110, 1120 and 1130 are wide enough to have some overlap, they are not absolutely inconsistent. In contrast, FIG. 11B shows an example of another three hyperdistributions 1140, 1150 and 1160 obtained from measurements of SWA at three different wavelengths. The hyperdistributions 1140, 1150 and 1160 also have a different mean and are much narrower than the hyperdistributions 1110, 1120 and 1130. The hyperdistributions 1140, 1150 and 1160 have essentially no overlap and thus are inconsistent.

Figure 12:
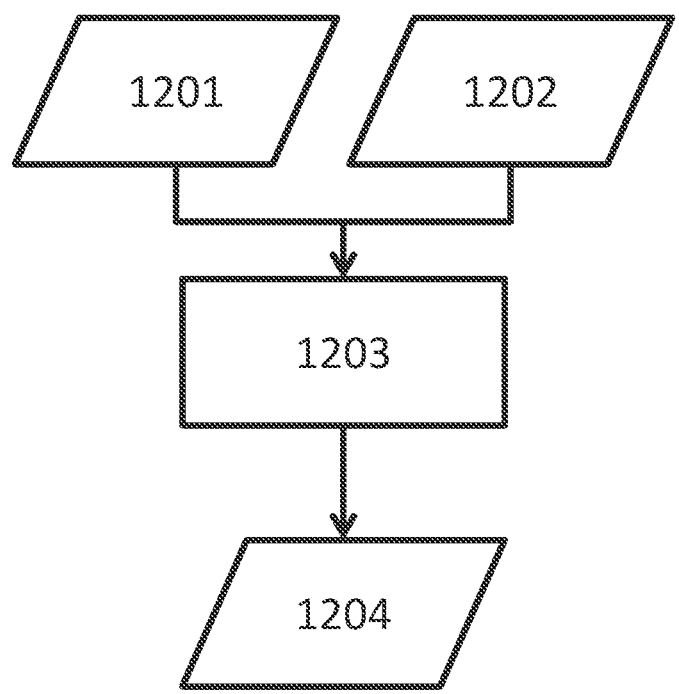
FIG. 12 schematically shows a flow for using statistical hierarchical reconstruction to guide future measurements.

The statistical hierarchical reconstruction can be updated as new measurements are made. The updated statistical hierarchical reconstruction can then be used to guide future measurements by modification of the fitting criteria of future measurements. FIG. 12 schematically shows a flow for using statistical hierarchical reconstruction to guide future measurements. An existing value of a hyperparameter or an existing hyperdistribution 1201 and a new measurement result 1202 are provided to the flow 1203 of FIG. 7. The word "new" here means that the measurement result 1202 was not used to arrive at the existing value of the hyperparameter or the existing hyperdistribution 1201. The flow 1203 provides an updated value of the hyperparameter or an updated hyperdistribution 1204.

Figure 13:
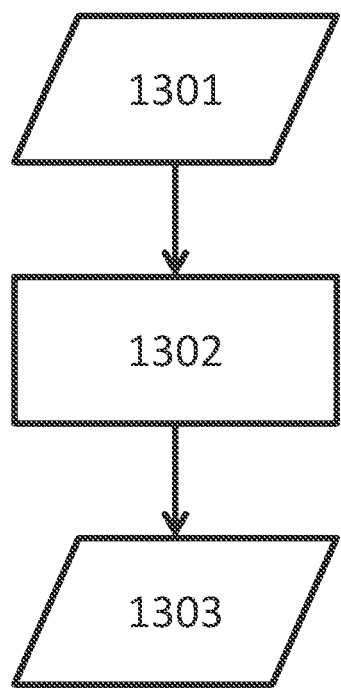
FIG. 13 schematically shows a flow for using statistical hierarchical reconstruction to guide measurements of different quantities.

A value of the hyperparameter or a hyperdistribution can be used to guide measurements of a different quantity. FIG. 13 schematically shows a flow for using statistical hierarchical reconstruction to guide measurements of a different quantity. A value of a hyperparameter or a hyperdistribution 1301 can be used in a simulation 1302 to determine a value or a distribution 1303 of another quantity. For example, when the hyperparameter or the hyperdistribution characterizes a CD, it can be used to determine a value or distribution of a yield of the lithographic process.

Figure 14:
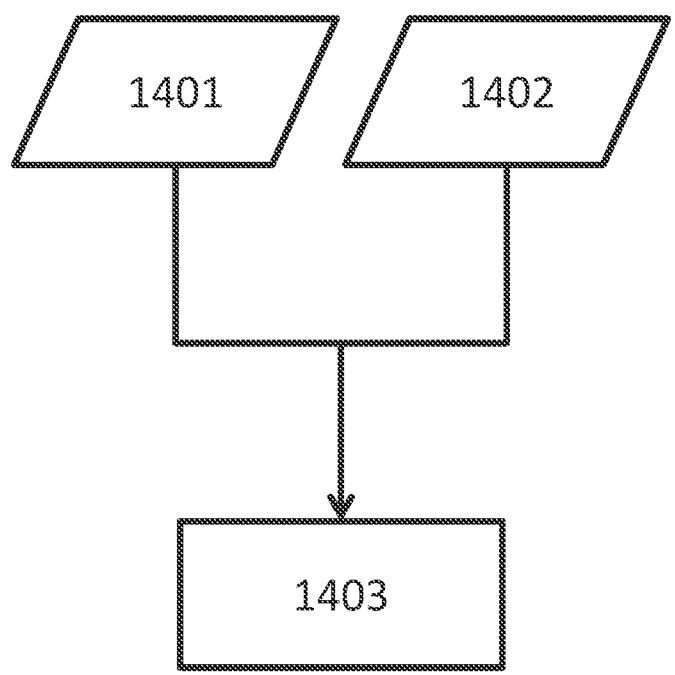
FIG. 14 schematically shows a flow for fitting a model against a measurement result.

A value of the hyperparameter may be used as initial values of a parameter of a model when the model is fit against a measurement result. FIG. 14 schematically shows a flow for fitting a model against a measurement result. An initial value of the parameter of a model may be set to the value 1401 of a hyperparameter and then, in 1403, the model can be fit against a measurement result 1402. For example, the result of the measurement may be a diffraction image measured from overlapping targets; the model may be configured to determine overlay from the diffraction image; the value of the hyperparameter may be the expectation of the overlay as determined using the flow of FIG. 7 from prior measurements. When the initial value is close to the true value of the parameter, less computational cost is needed for fitting the model against the measurement result.

Figure 15:
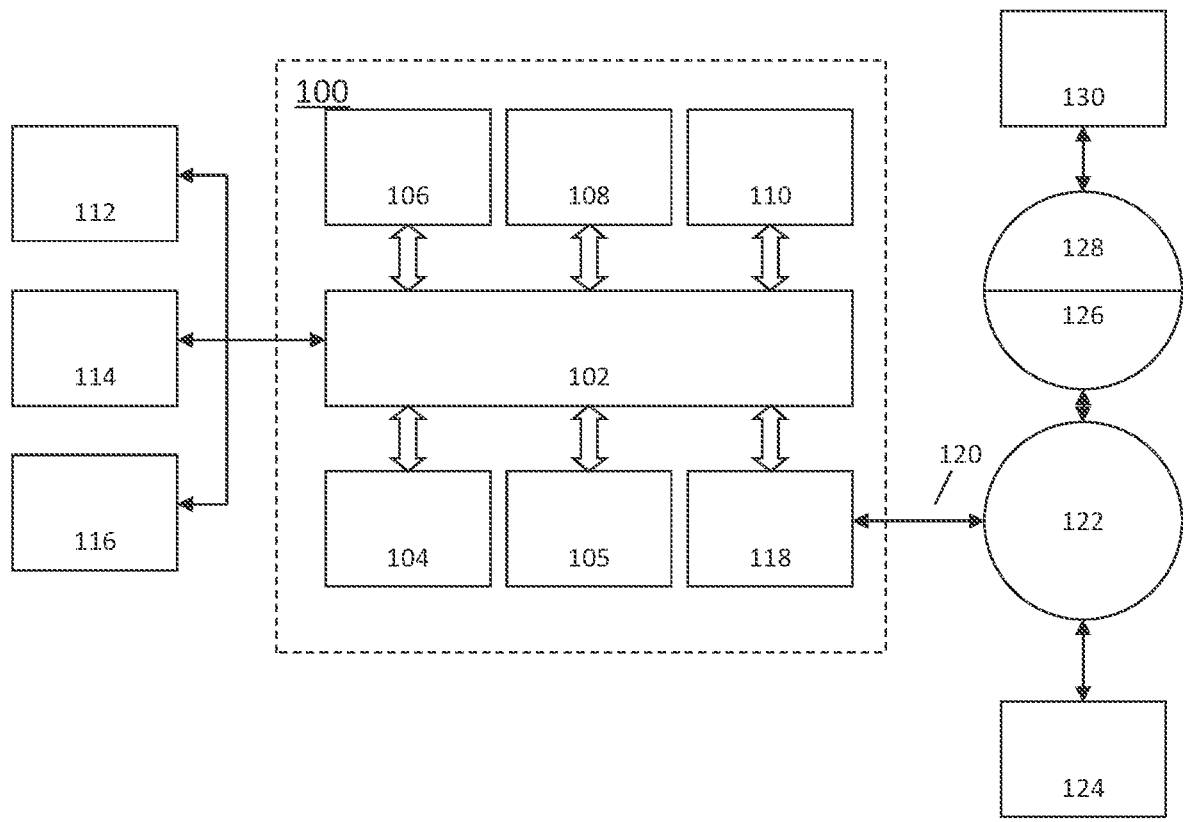
FIG. 15 is a block diagram that illustrates a computer system which can assist in implementing the methods and flows disclosed herein.

FIG. 15 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the processes herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also can include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for a process herein, for example. The received code may be executed by processor 104 as it is received, and/or stored in storage device 110, or other non-volatile storage for later execution. In this manner, computer system 100 may obtain application code in the form of a carrier wave.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
obtaining measurement results made by a physical inspection apparatus, the measurement results measured with respect to a lithographic apparatus, a deposition tool, an etcher apparatus, or a track apparatus used in a process for forming a structure using a substrate or measured with respect to a physical substrate physically processed by the process for forming a structure using a substrate;
obtaining sets of one or more values of one or more parameters of a distribution by fitting, by a hardware computer system, a model that simulates the distribution against the measurement results, respectively;
obtaining, by the hardware computer system, a set of one or more values of one or more hyperparameters of a hyperdistribution by fitting the hyperdistribution against the sets of values of the parameters; and
generating, based on the set of one or more values of one or more hyperparameters, electronic data to configure a measuring process involving a physical inspection apparatus.

2. The method of claim 1, wherein the measurement results have a same statistical distribution.

3. The method of claim 2, wherein the statistical distribution is a normal distribution.

4. The method of claim 1, wherein obtaining the measurement results comprises measuring a single target using a plurality of measurement recipes.

5. The method of claim 4, wherein the plurality of measurement recipes differ in polarization, wavelength, incident angle, or a combination thereof.

6. The method of claim 1, wherein obtaining the measurement results comprises measuring nominally identical copies of a target.

7. The method of claim 1, wherein obtaining the measurement results comprises obtaining diffraction images using a scatterometer, obtaining overlay from overlapping targets, obtaining critical dimension, obtaining sidewall angle (SWA), obtaining height, obtaining extinction coefficient, obtaining refractive index, obtaining dispersion model parameters, or a combination thereof, from a pattern on a substrate.

8. The method of claim 1, wherein obtaining the measurement results comprises obtaining processing parameters of the process for forming a structure using a substrate.

9. The method of claim 1, further comprising feeding back the values of the one or more hyperparameters to the fitting of the distribution against the measurement results.

10. A method comprising:
obtaining a value of a parameter of a simulation model;
obtaining a plurality of simulated measurement results using the simulation model;
obtaining a value of a hyperparameter using the method of claim 1; and
determining, using a computer, credibility of the value of the hyperparameter or credibility of the value of the parameter using the value of the hyperparameter and the value of the parameter.

11. The method of claim 10, wherein determining credibility of the value of the hyperparameter or credibility of the value of the parameter comprises using a standard deviation of a difference between the value of the hyperparameter and the value of the parameter.

12. The method of claim 11, wherein determining credibility of the value of the hyperparameter or credibility of the value of the parameter comprises using an average predictive uncertainty.

13. The method of claim 10, further comprising determining a quality of the simulated measurement results using the credibility.

14. A method comprising:
obtaining a first value of a hyperparameter or a first hyperdistribution using the method of claim 1 from measurement results under a first condition;
obtaining a second value of the hyperparameter or a second hyperdistribution using the method of claim 1 from measurement results under a second condition; and
determining consistency between measurements at the first condition and measurements at the second condition using the first or second value of the hyperparameter or the first or second hyperdistribution.

15. The method of claim 14, wherein the measurements are diffraction based overlay, diffraction based focus, reconstruction based CD, differential based CD, imaging based CD or reconstruction based profile parameters.

16. A computer program product comprising a non-transitory computer readable medium having instructions recorded thereon, the instructions when executed by a computer system configured to cause the computer system to at least:
obtain measurement results made by a physical inspection apparatus, the measurement results measured with respect to a lithographic apparatus, a deposition tool, an etcher apparatus, or a track apparatus used in a process for forming a structure using a substrate or measured with respect to a physical substrate physically processed by the process for forming a structure using a substrate;
obtain sets of one or more values of one or more parameters of a distribution by fitting a model that simulates the distribution against the measurement results, respectively;
obtain a set of one or more values of one or more hyperparameters of a hyperdistribution by fitting the hyperdistribution against the sets of values of the parameters; and
generate, based on the set of one or more values of one or more hyperparameters, electronic data to configure a measuring process involving a physical inspection apparatus.

17. The computer program product of claim 16, wherein the instructions are further configured to cause the computer system to feed back the values of the one or more hyperparameters to the fitting of the distribution against the measurement results.

18. The computer program product of claim 16, wherein the instructions are further configured to cause the computer system to:
obtain a value of a parameter of a simulation model;
obtain a plurality of simulated measurement results using the simulation model;
obtain a value of a hyperparameter of the one or more hyperparameters; and
determine credibility of the value of the hyperparameter or credibility of the value of the parameter using the value of the hyperparameter and the value of the parameter.

19. A method comprising:
obtaining measurement results made by a physical inspection apparatus, the measurement result measured with respect to a lithographic apparatus, a deposition tool, an etcher apparatus, or a track apparatus used in a process for forming a structure using a substrate or measured with respect to a physical substrate physically processed by the process for forming a structure using a substrate;
obtaining sets of one or more values of one or more parameters of a distribution by fitting, by a hardware computer system, a model that simulates the distribution against the measurement results, respectively;
obtaining, by the hardware computer system, a set of one or more values of one or more hyperparameters of a hyperdistribution by fitting the hyperdistribution against the sets of values of the parameters; and
using, by the hardware computer, the set of one or more values of one or more hyperparameters to obtain or verify a value of a parameter representing a physical property of the lithographic apparatus, the deposition tool, the etcher apparatus, or the track apparatus, of the process for forming a structure using a substrate, or of the physical substrate physically processed by the process for forming a structure using a substrate.

20. A computer program product comprising a non-transitory computer readable medium having instructions recorded thereon, the instructions when executed by a computer system configured to cause the computer system to at least:
obtain measurement results made by a physical inspection apparatus, the measurement result measured with respect to a lithographic apparatus, a deposition tool, an etcher apparatus, or a track apparatus used in a process for forming a structure using a substrate or measured with respect to a physical substrate physically processed by the process for forming a structure using a substrate;
obtain sets of one or more values of one or more parameters of a distribution by fitting a model that simulates the distribution against the measurement results, respectively;
obtain a set of one or more values of one or more hyperparameters of a hyperdistribution by fitting the hyperdistribution against the sets of values of the parameters; and
use the set of one or more values of one or more hyperparameters to obtain or verify a value of a parameter representing a physical property of the lithographic apparatus, the deposition tool, the etcher apparatus, or the track apparatus, of the process for forming a structure using a substrate, or of the physical substrate physically processed by the process for forming a structure using a substrate.

* * * * *